United States Patent
Sato et al.

(10) Patent No.: US 7,597,260 B2
(45) Date of Patent: Oct. 6, 2009

(54) MEMORY CARD

(75) Inventors: Koki Sato, Shinagawa (JP); Hideo Miyazawa, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 11/325,447

(22) Filed: Jan. 5, 2006

(65) Prior Publication Data

US 2006/0283959 A1 Dec. 21, 2006

(30) Foreign Application Priority Data

Jun. 17, 2005 (JP) ............................. 2005-177641

(51) Int. Cl.
*G06K 7/00* (2006.01)
(52) U.S. Cl. ...................................... 235/441; 235/492
(58) Field of Classification Search ................. 235/492, 235/441; 439/368, 630, 638, 76.1
See application file for complete search history.

(56) References Cited

U.S. PATENT DOCUMENTS

| 5,166,503 | A   | * | 11/1992 | Mizuta  | ....................... 235/492 |
| 5,550,709 | A   | * | 8/1996  | Iwasaki | ....................... 361/684 |
| 6,274,926 | B1  | * | 8/2001  | Iwasaki | ....................... 257/679 |
| 2004/0229511 | A1 | * | 11/2004 | Chen   | .......................... 439/638 |

FOREIGN PATENT DOCUMENTS

JP             6-62026         8/1994

* cited by examiner

*Primary Examiner*—Daniel A Hess
(74) *Attorney, Agent, or Firm*—Staas & Halsey LLP

(57) ABSTRACT

A memory card having a main body with a memory chip module including a memory chip mounted thereon on a board is installed in a memory card main body. The memory card includes a plurality of terminal members provided in the memory card main body in line, each terminal member having a first terminal part and a second terminal part. The first terminal part of the terminal member is provided at a side of a head end of a lower surface of the memory card so as to be exposed. The second terminal part of the terminal member is connected to the memory chip module.

4 Claims, 20 Drawing Sheets

FIG.2
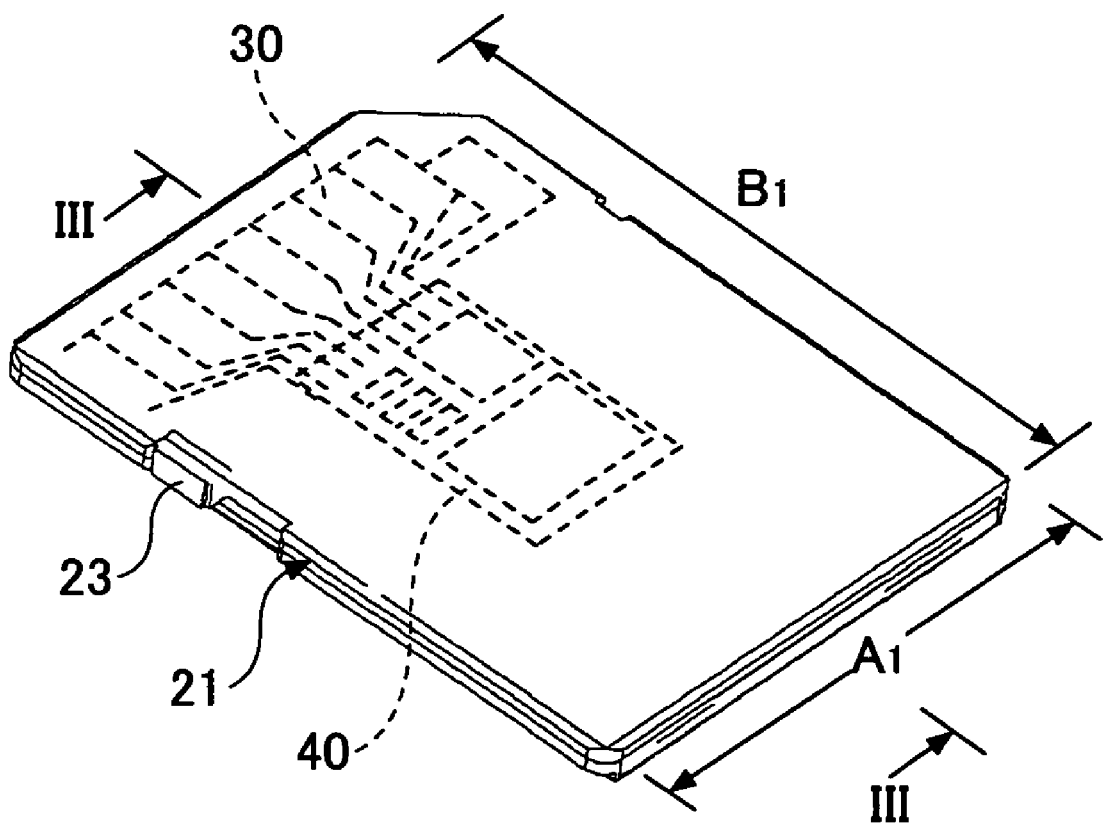
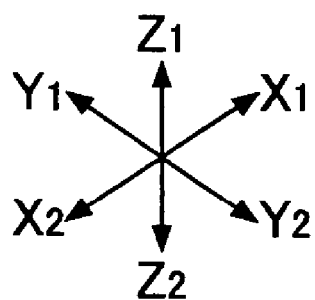

FIG.3
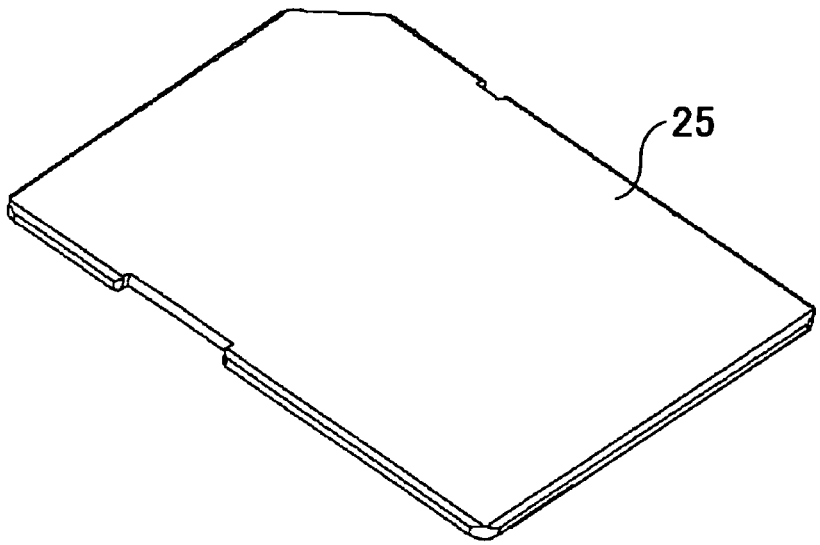
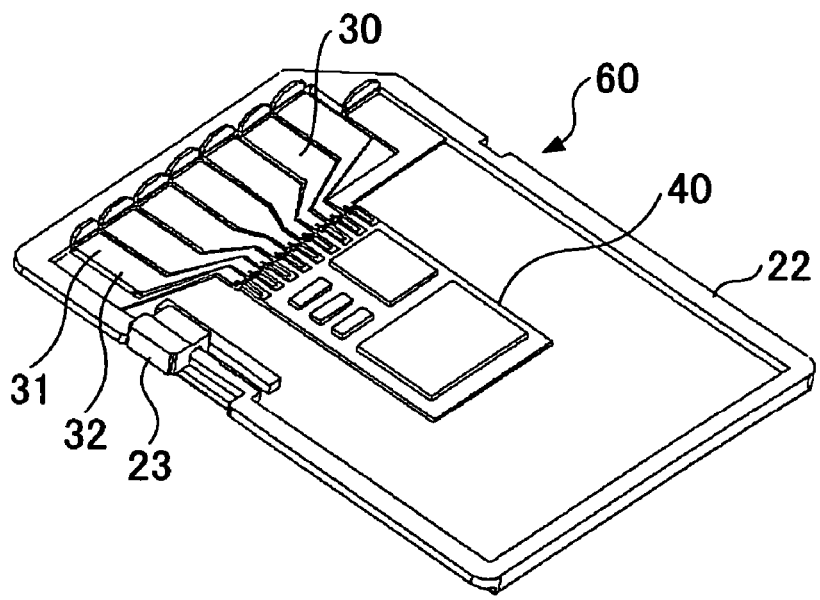

FIG.5
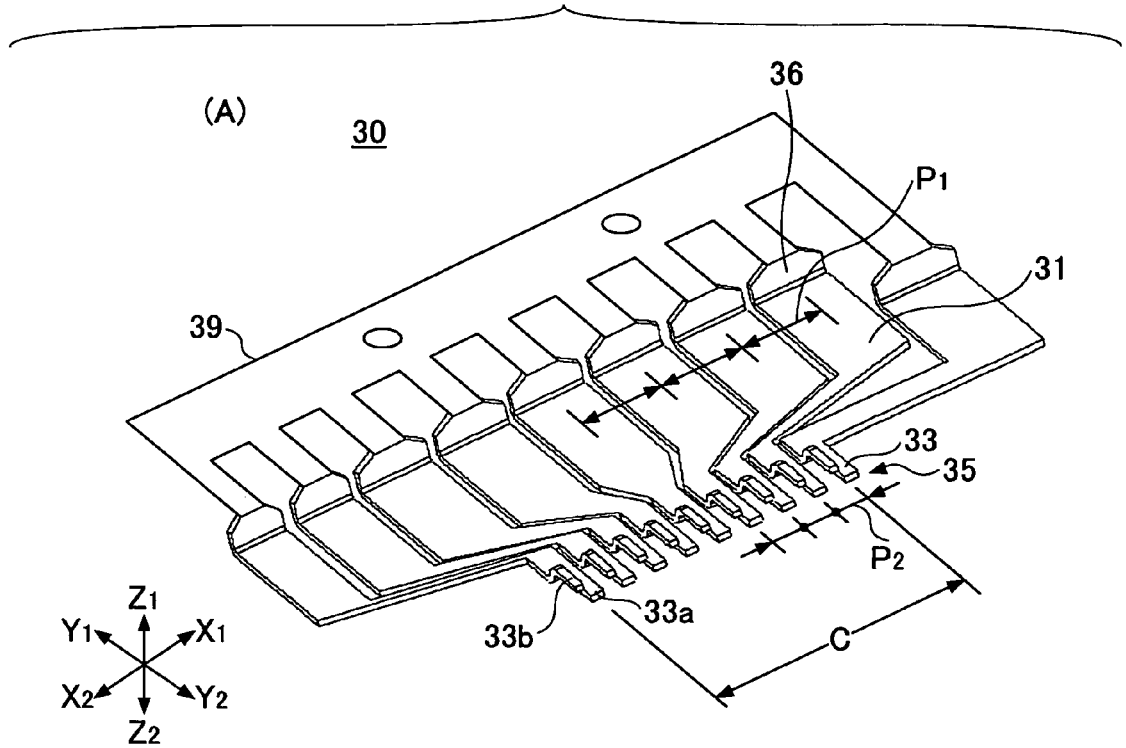
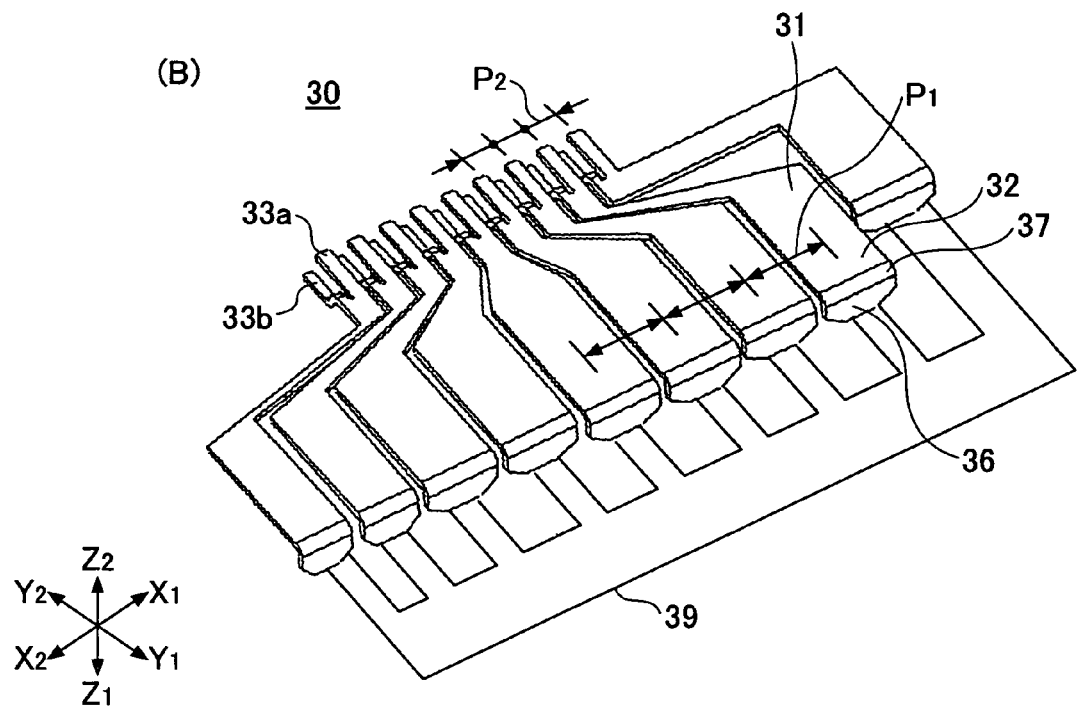

$A_2 < A_1$
$B_2 < B_1$

FIG.14
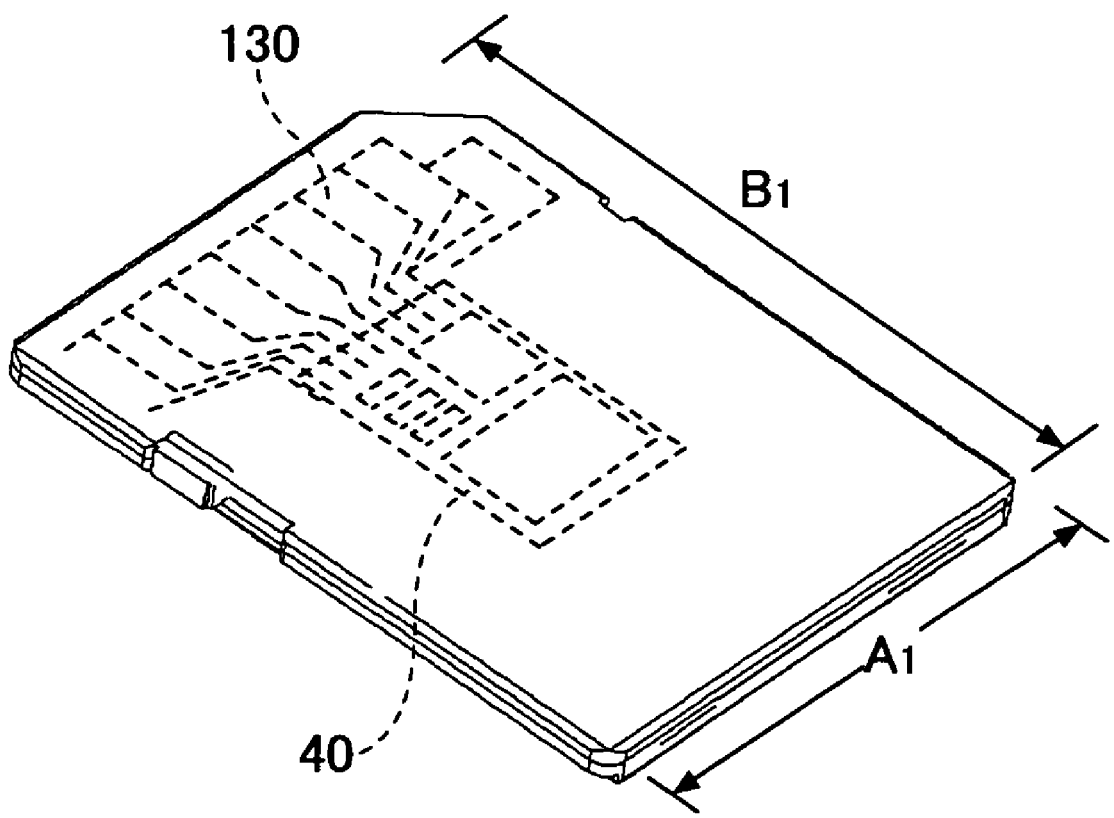
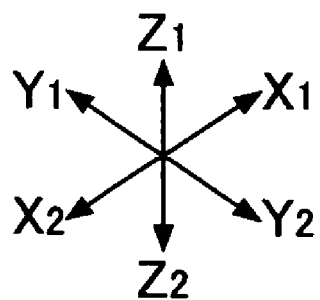

FIG.15
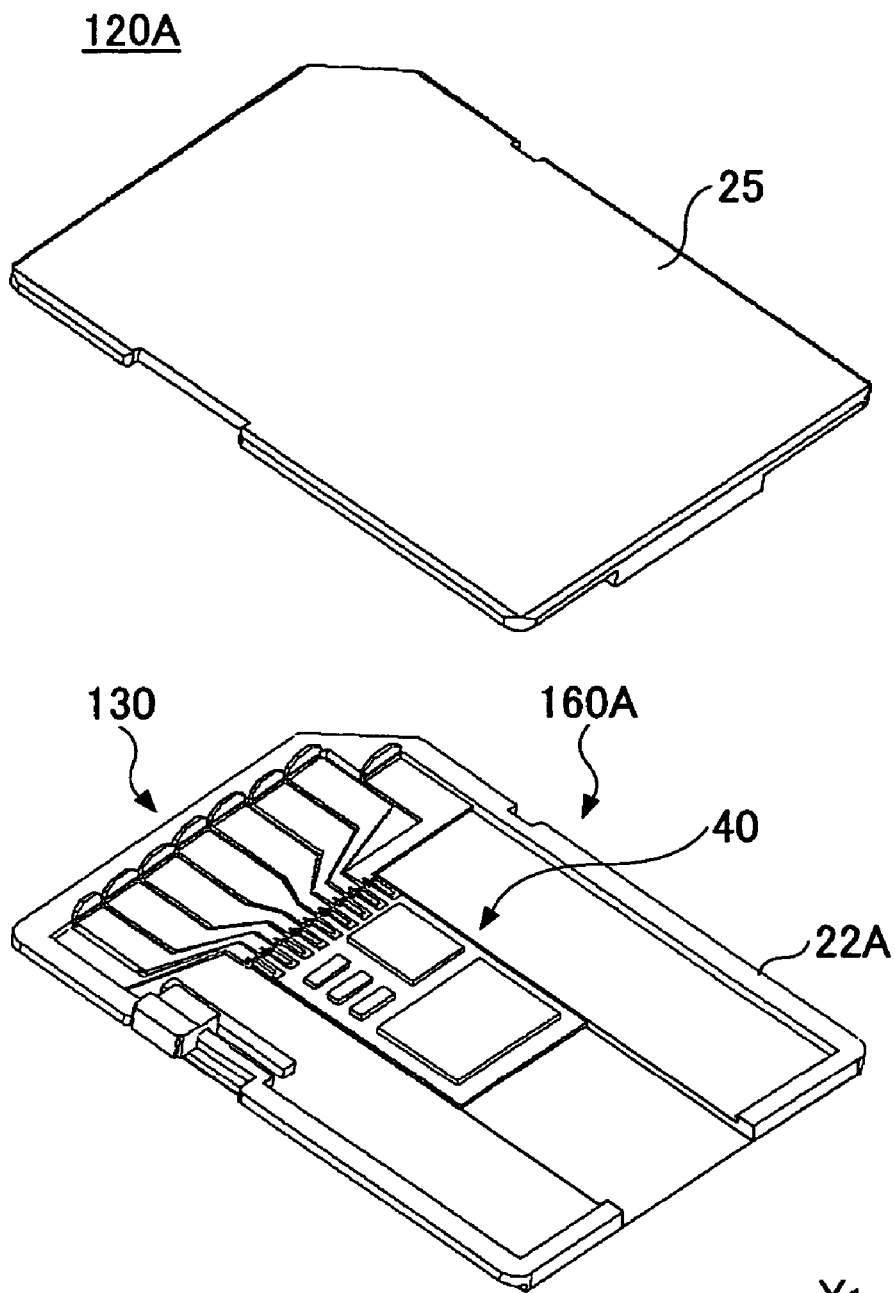
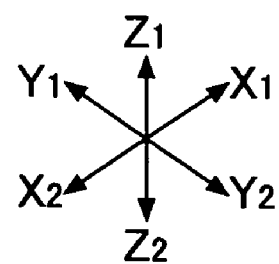

MEMORY CARD

BACKGROUND OF THE INVENTION

1. Field of the Invention

The present invention generally relates to memory cards, and more specifically, to a memory card installed and used in a personal computer, a potable phone, a digital camera, or the like.

2. Description of the Related Art

At present, a normal size memory card and a small size memory card are in the market as memory cards using a semiconductor flash memory chip. The normal size memory card is installed in the personal computer. The small size memory card is installed in the portable phone, the digital camera, or the like. In addition, a micro memory card having a smaller size than the above-mentioned small size memory card is planed to be sold.

The above-mentioned memory cards usually have the same type of semiconductor flash memory. Hence, it is required to efficiently manufacture different kinds of memory cards.

FIG. 1 is an exploded perspective view of a related art memory card 1. The memory card 1 has a structure where a memory chip module 10 is received between a lower case 2 and an upper case 5. A writing protect knob 3 is provided on the lower case 2 and plural windows 4 are provided in line at a head end side of the lower case 2.

The memory chip module 10 has a structure where a semiconductor flash memory chip 12, a control chip 13, and others are mounted on an upper surface 11a of a printed circuit board 11. Plural pad-shaped terminals 15 are formed along a head end edge of a lower surface 11b of the printed circuit board 11.

The pad-shaped terminals 15 are exposed from the windows 3 of the lower case of the memory card 1.

In the meantime, the small size memory card has a structure where a memory chip module for the small size memory card is received between a lower case and an upper case for the small size memory card. See Japan Pre-Grant Patent Publication No. 6-62026.

Thus, if an exclusive memory chip module is installed for every kind of the memory card, memory chip modules having different sizes should be prepared for every kind of the memory cards so that management of parts becomes complicated and it is difficult to reduce the manufacturing cost.

In addition, the above-mentioned pad-shaped terminals 15 includes a gold (Au) plating layer formed by gold-plating on a printed circuit board such as FR4 or the like. Therefore, it is difficult to heighten the mechanical strength and a problem of degraded reliability of an electrical connection in a case where the memory card is installed in an electronic apparatus may happen.

SUMMARY OF THE INVENTION

Accordingly, it is a general object of the present invention to provide a novel and useful memory card.

The above object of the present invention is achieved by a memory card having a structure where a memory chip module wherein a memory chip is mounted on a board is installed in a memory card main body, the memory card including:

a plurality of terminal members provided in the memory card main body in line, each of the terminal members having a first terminal part and a second terminal part;

wherein the first terminal part of the terminal member is provided at a side of a head end of a lower surface of the memory card so as to be exposed; and the second terminal part of the terminal member is connected to the memory chip module.

According to the above-mentioned memory card, since the terminal member has a first terminal part and a second terminal part, the first terminal part of the terminal member is provided at a side of a head end of a lower surface of the memory card so as to be exposed, and the first terminal part of the terminal member is connected to the memory chip module. Therefore, it is possible to make the reliability of the connection to the electronic apparatus high.

The above object of the present invention is achieved by a memory card, including:

a memory card main body;

a plurality of terminal members provided in the memory card main body in line; and a memory chip module installed in the memory card main body;

wherein the memory chip module has a structure where a memory chip is mounted on a board and a plurality of pad-shaped terminals are provided at an end of the board;

each of the terminal members has a first terminal part and a second terminal part;

the first terminal part is exposed to a lower surface at a side of a head end of the memory card main body; and the second terminal part is provided in arrangement with a corresponding pad-shaped terminal and connected to the corresponding pad-shaped terminal.

The memory card main body may be a synthetic resin molded article; and the terminal members may be insert-molded in the memory card main body.

The second terminal part of the terminal member may have a fork-shaped configuration;

an edge of the board of the memory chip module, the edge being where the pad-shaped terminal are formed, may be held by the second terminal part.

The second terminal part of the terminal member may have a bump-shaped configuration;

an edge of the board of the memory chip module, the edge being where the pad-shaped terminal is formed, may be adhered to the second terminal part.

The terminal member may have a curved shaped configuration part provided at a head end side of the first terminal part.

The memory chip module may be smaller than a minimum size memory card.

According to the above mentioned memory card, it is possible to manufacture plural memory cards of different kinds at a cost lower than the conventional memory card by making the memory chip module smaller than the minimum size memory card so that the memory chip module can be commonly used for plural memory cards having different sizes.

Other objects, features, and advantages of the present invention will be come more apparent from the following detailed description when read in conjunction with the accompanying drawings.

BRIEF DESCRIPTION OF THE DRAWINGS

FIG. 2 is a perspective view of a memory card of a first embodiment of the present invention;

FIG. 3 is an exploded perspective view of the memory card of the first embodiment of the present invention;

FIG. 5-(A) is a perspective view of a terminal member group and FIG. 5-(B) is a perspective view of the terminal member group shown in FIG. 5-(A) where the terminal member group is turned over;

FIG. 14 is a perspective view of a memory card of a third embodiment of the present invention;

FIG. 15 is an exploded perspective view of the memory card of the third embodiment of the present invention;

DETAILED DESCRIPTION OF THE PREFERRED EMBODIMENTS

A description is given below, with reference to the FIG. 2 through FIG. 20 of embodiments of the present invention.

First Embodiment

FIG. 2 is a perspective view of a memory card 20 of a first embodiment of the present invention. In FIG. 2, X1-X2 shows a width direction of the memory card 20, Y1-Y2 shows a longitudinal direction of the memory card 20, and Z1-Z2 shows a thickness direction of the memory card 20.

FIG. 3 is an exploded perspective view of the memory card 20 of the first embodiment of the present invention. In FIG. 3, X1-X2 shows a width direction of the memory card 20, Y1-Y2 shows a longitudinal direction of the memory card 20, and Z1-Z2 shows a thickness direction of the memory card 20.

Figure 1:
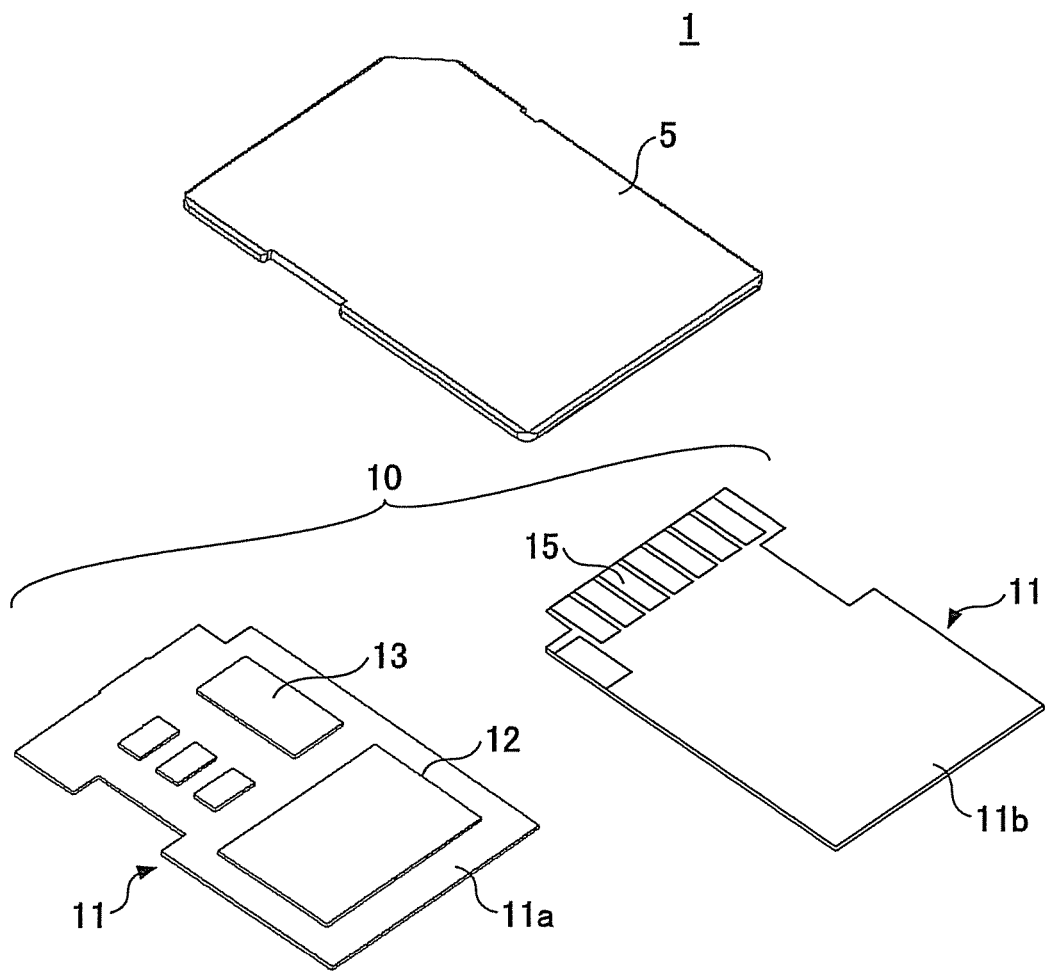
FIG. 1 is an exploded perspective view of a related art memory card.
Figure 4:
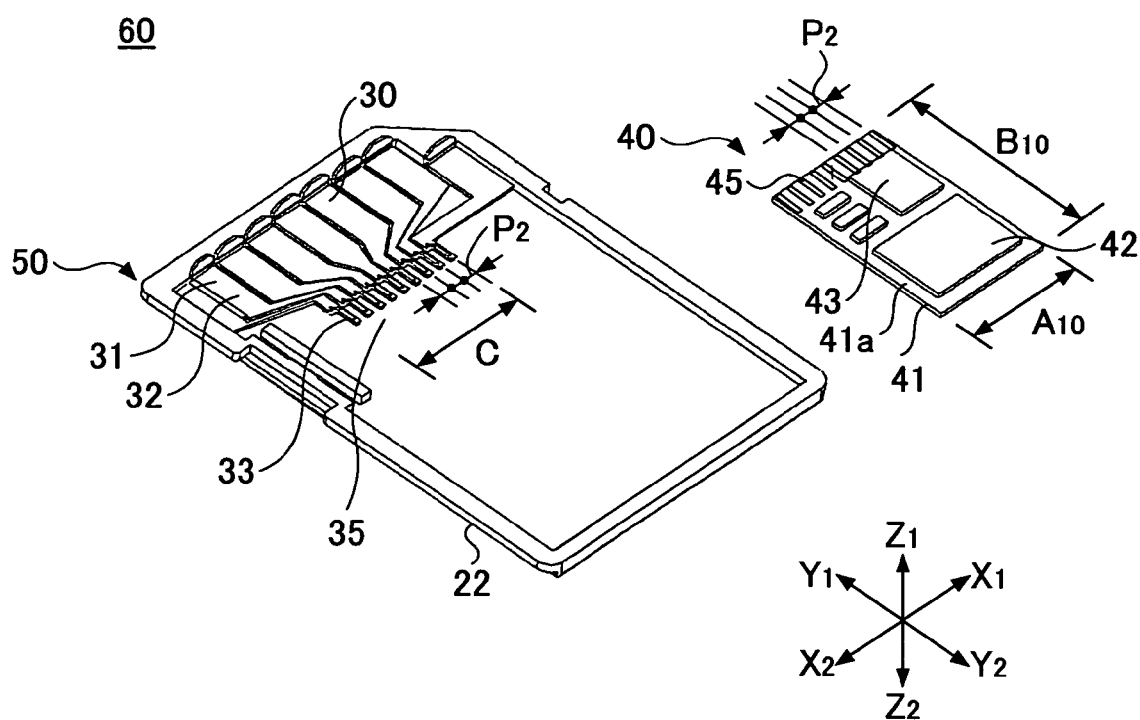
FIG. 4 is an exploded perspective view of a lower case assembly body of the memory card of the first embodiment of the present invention.

FIG. 4 is an exploded perspective view of a lower case assembly body 60 of the memory card 20 of the first embodiment of the present invention. In FIG. 4, X1-X2 shows a width direction of the lower case assembly body 60, Y1-Y2 shows a longitudinal direction of the lower case assembly body 60, and Z1-Z2 shows a thickness direction of the lower case assembly body 60. In FIG. 4, for the convenience of explanation, the illustration of a resin part 22a shown in FIG. 7 and covering a terminal member 31 is omitted.

The width in X1-X2 direction of the memory card 20 is A1. The length in Y1-Y2 direction of the memory card 20 is B1. Hence, the memory card 20 has an area of A1×B1.

The memory card 20 includes a memory card main body 21, a terminal member group 30, and a memory chip module 40.

The memory card main body 21 includes a lower case 22 which is a resin molded article and an upper case 25 which is also a resin molded article. A writing protect knob 23 is provided on the lower case 22.

The terminal member group 30 is provided in the lower case 22 so as to form a terminal member group attaching lower case 50. The memory chip module 40 is provided in the terminal member group attaching lower case 50 so as to form a lower case assembly body 60.

In the meantime, FIG. 5-(A) is a perspective view of the terminal member group 30 and FIG. 5-(B) is a perspective view of the terminal member group 30 shown in FIG. 5-(A) where the terminal member group 30 is turned over.

Referring to FIG. 5-(A) and FIG. 5-(B), the terminal member group 30 is formed by plural terminal members 31 provided in lane and made of metal plates. The plural terminal members 31 are arranged by a tie bar 39 having a comb teeth-shaped configuration so as to form a substantially fan-shaped configuration.

Each of the terminal members 31 has a memory card terminal part 32 as a first terminal part provided at a Y1 side and a memory chip module terminal part 33 as a second terminal part provided at a Y2 side.

The memory card terminal part 32 has a plane-shaped configuration. The memory chip module terminal part 33 includes a lower side terminal piece 33a having a finger-shaped configuration and an upper side terminal piece 33b having a finger-shaped configuration and a spring capability. The memory chip module terminal part 33 has a fork-shaped configuration.

The memory card terminal parts 32 are arranged in line with a pitch $P_1$. The memory chip module terminal parts 33 are arranged in the center of the X1-X2 direction of the terminal member group 30 with a pitch $P_2$.

The pitch $P_2$ of the memory chip module terminal part 33 is equal to the pitch $P_2$ of a pad shaped terminal 45 of a memory chip module 40 (See FIG. 4). The pitch $P_2$ is smaller than the pitch $P_1$ and is approximately one third of the pitch $P_1$.

A length C in an X direction of the memory chip module terminal group 35 formed by the memory chip module terminal parts 33 is approximately one third of the width A1 of the memory card 20.

A Y1 side end of the terminal member 31 is bent and curved in a Z1 direction so that a bending piece 36 is connected to the tie bar 39. A curved-shaped configuration part 37 is provided at a Y1 end of the memory card terminal part 32.

Figure 6:
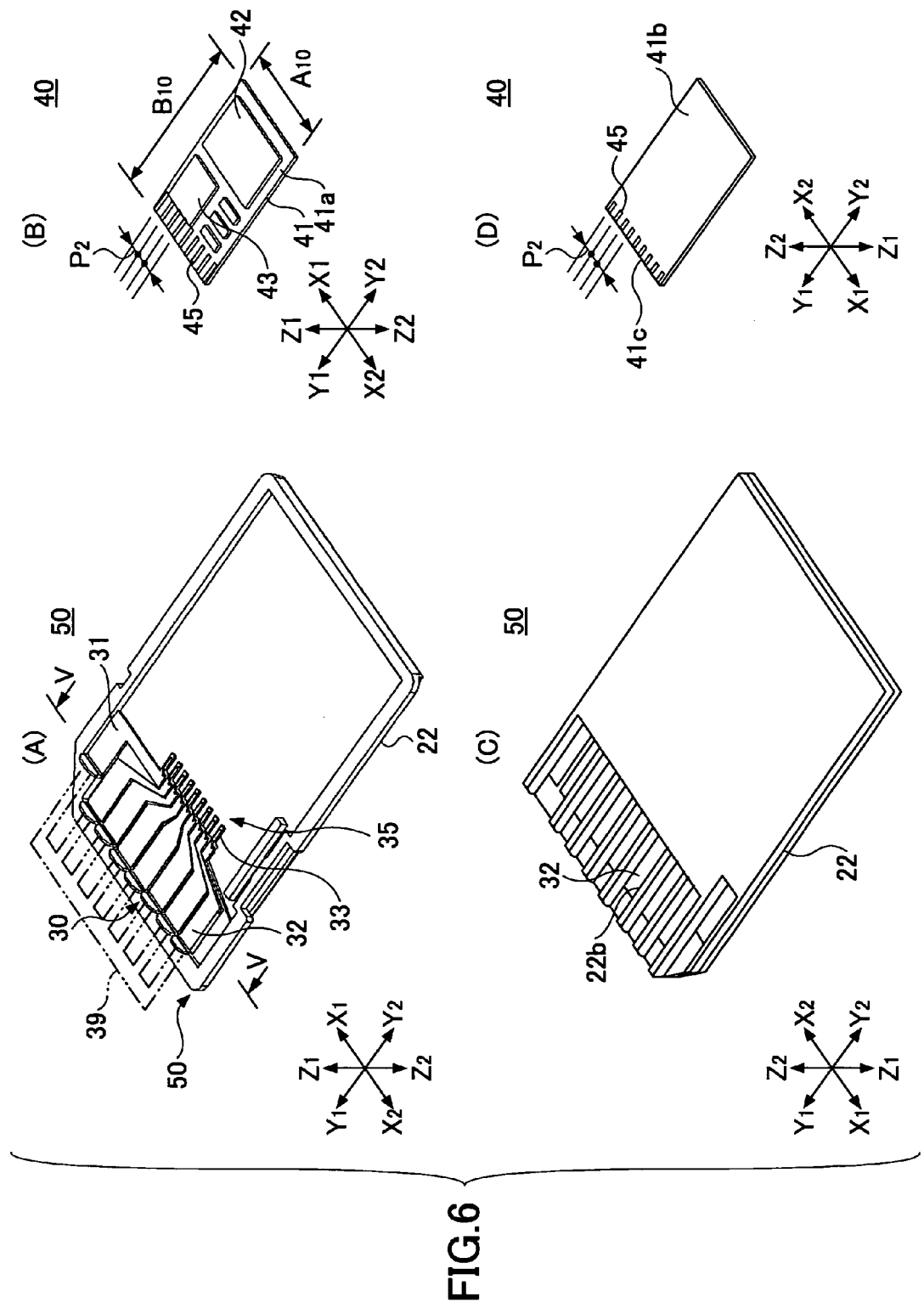
FIG. 6 is a perspective view showing a terminal group attaching lower case 50 and a memory chip module 40 which correspond to each other.

FIG. 6 is a perspective view showing the terminal group attaching lower case 50 and the memory chip module 40 which correspond to each other.

More specifically, FIG. 6-(A) is a perspective view of the terminal group attaching lower case 50 and FIG. 6-(B) is a perspective view of the terminal group attaching lower case 50 shown in FIG. 5-(A) where the terminal group attaching lower case 50 is turned over. FIG. 6-(C) is a perspective view of the terminal group attaching lower case 40 and FIG. 6-(D)

is a perspective view of the terminal group attaching lower case 40 shown in FIG. 5-(C) where the terminal group attaching lower case 40 is turned over.

Figure 7:
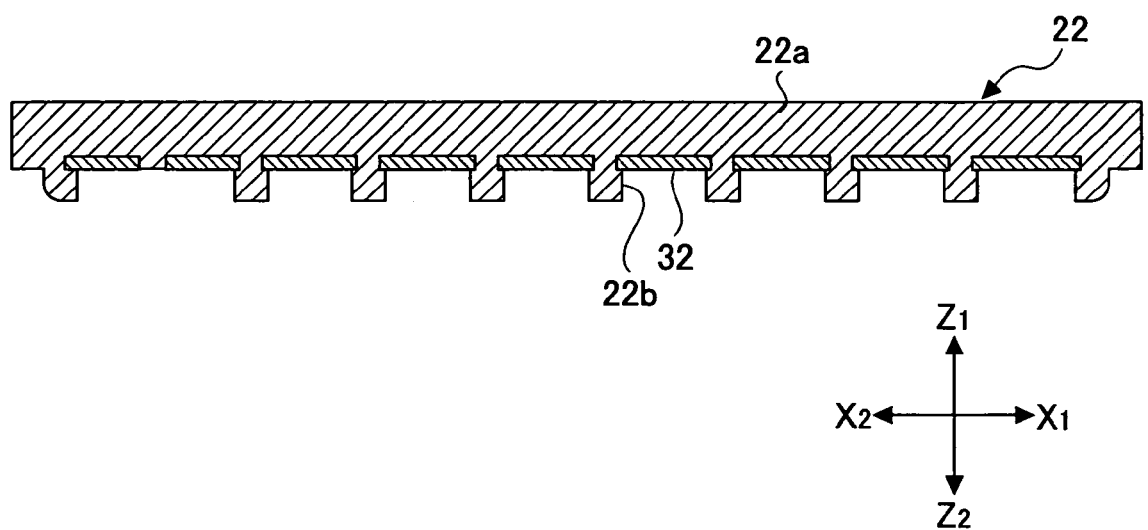
FIG. 7 is an enlarged cross-sectional view taken along a line V-V of FIG. 6.

In FIG. 6-(A) and FIG. 6-(C), for the convenience of explanation, the illustration of the resin part 22a shown in FIG. 7 and covering the terminal member 31 is omitted.

The memory chip module 40, as shown in FIG. 6-(B) and FIG. 6-(D), has a structure where a memory chip 42, a control chip 43, and others are mounted on an upper surface 41a of a printed circuit board 41 having an area of A10×B10 and plural pad-shaped terminals 45 including a gold (Au) plating layer formed by gold-plating on an upper surface 41a and a lower surface 41b of a printed circuit board 41 along an Y1 side edge 41c, are arranged with a pitch $P_2$. No parts are mounted on the lower surface 41b of the printed circuit board 41, as shown in FIG. 4-(D). The area of A10×B10 is smaller than the size of a smallest size memory card, namely a minimum size memory card.

Referring to FIG. 6-(A) and FIG. 6-(C), the terminal member group 30 is inserted in a mold so that the lower case 22 is resin-molded in a body with the terminal member group 30. After resin-molding, the tie bar 39 is cut off so that the terminal members 31 are independent of each other.

FIG. 7 is an enlarged cross-sectional view taken along a line V-V of FIG. 6.

As shown in FIG. 7, plural memory card terminal parts 32 are covered with a part 22a of the lower case 22 of the terminal group attaching lower case 50 so as to be in a body with the lower case 22.

As shown in FIG. 6-(C) and FIG. 7, the memory card terminal parts 32 are exposed from the windows of the lower case 22. As shown in FIG. 4 and FIG. 6-(A), the memory chip module terminal part group 35 is positioned in the substantially center of the lower case 22 and the memory chip module terminal parts 33 are arranged in an X1-X2 direction.

As shown in FIG. 3, for the purpose of assembly of the memory card 20, the memory chip module 40 is provided in the lower case 22 so that the terminal group attaching lower case 50 is assembled.

Figure 8:
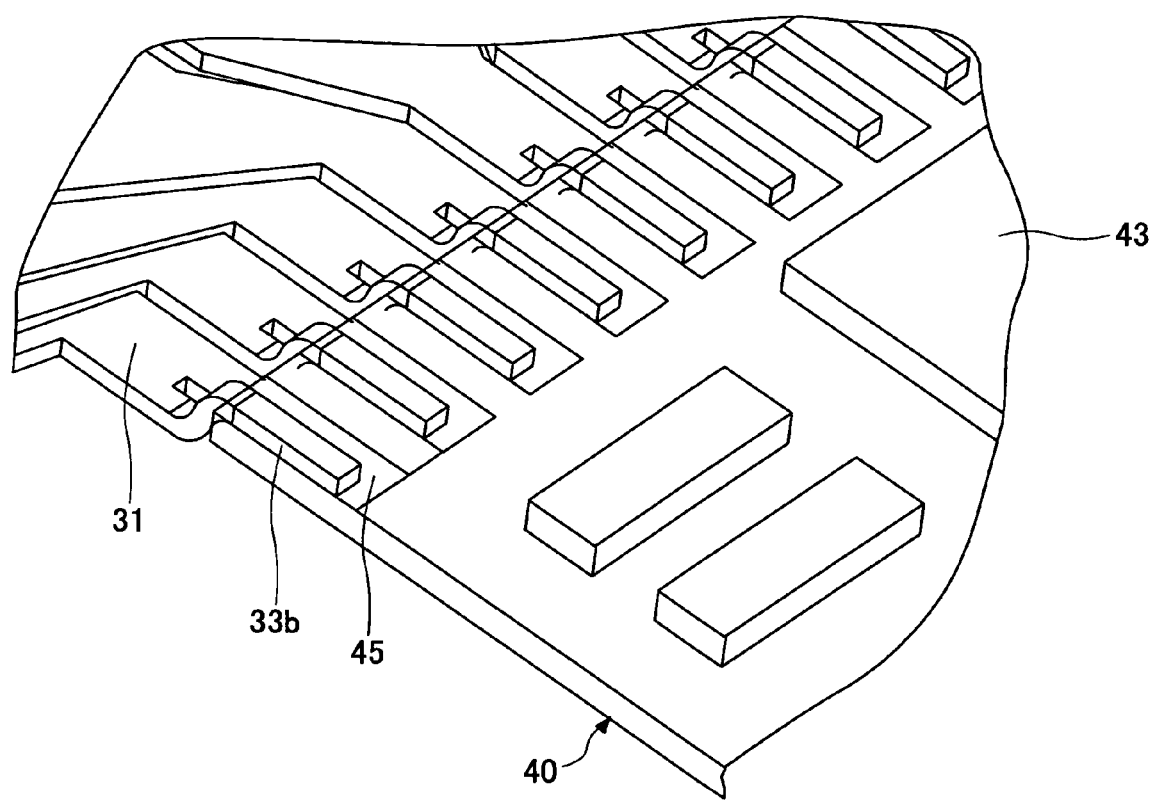
FIG. 8 is an enlarged view of a connection part of the memory chip module and the terminal member group shown in FIG. 3.

FIG. 8 is an enlarged view of a connection part of the memory chip module and the terminal member group shown in FIG. 3.

Referring to FIG. 5 and FIG. 8, the Y1 side edge of the printed circuit board 41 is inserted into the memory chip module terminal part 33 having a fork-shaped configuration so as to be elastically put between the lower side terminal piece 33a and the upper side terminal piece 33b. The lower side terminal piece 33a and the upper side terminal piece 33b come in contact with the corresponding pad-shaped terminal 45 so that the memory chip module 40 is in an electrically connected state.

The upper case 25 covers the lower case assembly body 60 and the periphery part of the upper case 25 is supersonically adhered to the periphery part of the lower case 22.

Figure 9:
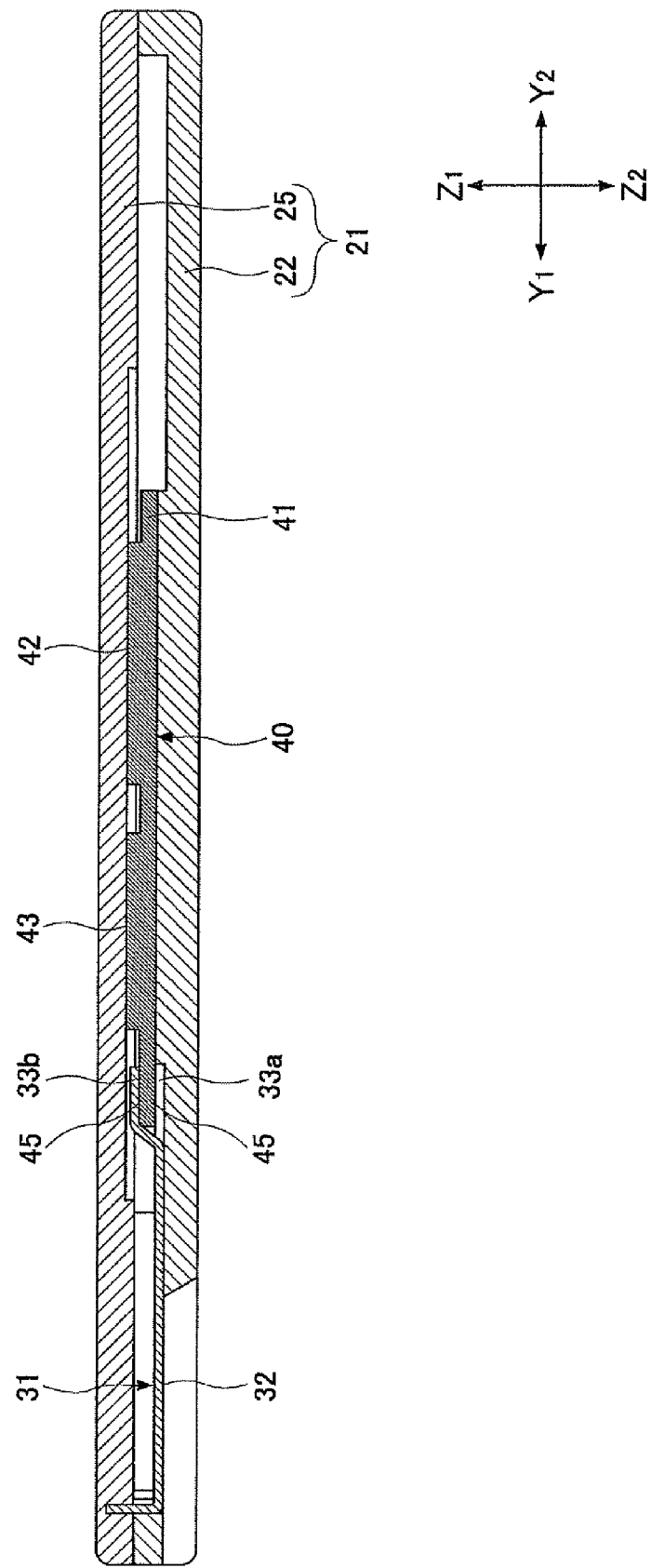
FIG. 9 is an enlarged cross-sectional view taken along a line III-III of FIG. 2.

FIG. 9 is an enlarged cross-sectional view taken along a line III-III of FIG. 2. In FIG. 9, X1-X2 shows a width direction of the memory card 20, Y1-Y2 shows a longitudinal direction of the memory card 20, and Z1-Z2 shows a thickness direction of the memory card 20.

By the above-discussed assembling process, as shown in FIG. 3, the upper case 25 presses the memory chip module 40 and the memory chip module 40 is received in the memory card main body 21, so that the memory card 20 having a structure where plural terminal members 31 are arranged in line in the memory card 21 is assembled.

The memory card terminal part 32 which rubs and comes in contact with a terminal in a slot of an electronic apparatus is a part of the terminal member 31. Therefore, the memory card has high durability and higher reliability of connection to the electronic apparatus as compared with a related art memory card.

Because of the curved-shaped configuration part 37, installation of the memory card 20 into the slot of the electronic apparatus can be done smoothly.

Instead of insert molding, it is possible to put the independent terminal members 31 on the lower case 22 having the windows.

Second Embodiment

Figure 10:
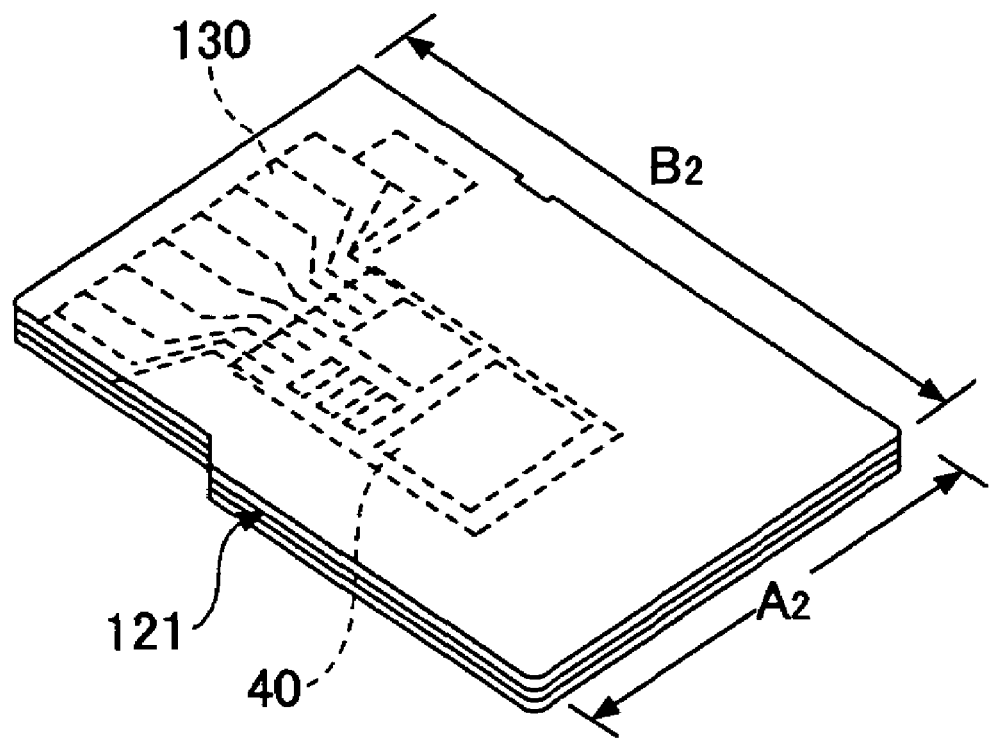
FIG. 10 is a perspective view of a small size memory card of a second embodiment of the present invention.
Figure 11:
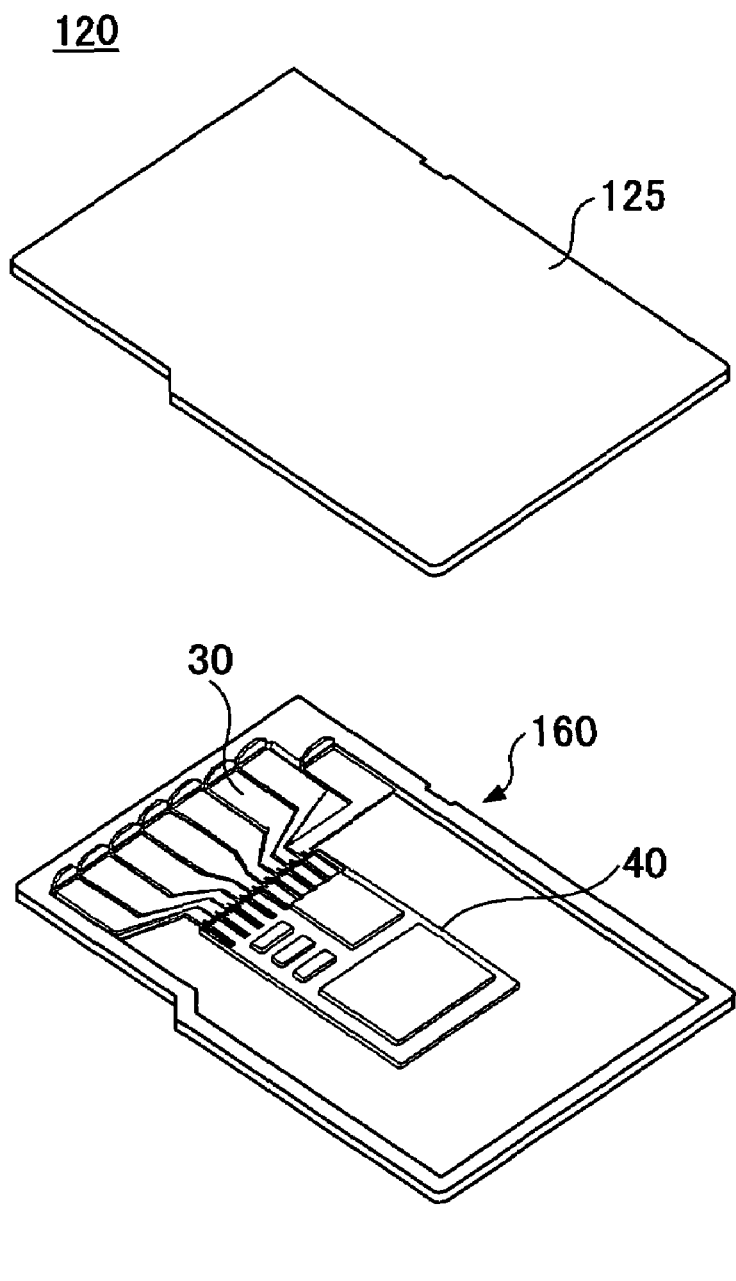
FIG. 11 is an exploded perspective view of the small size memory card of the second embodiment of the present invention.
Figure 12:
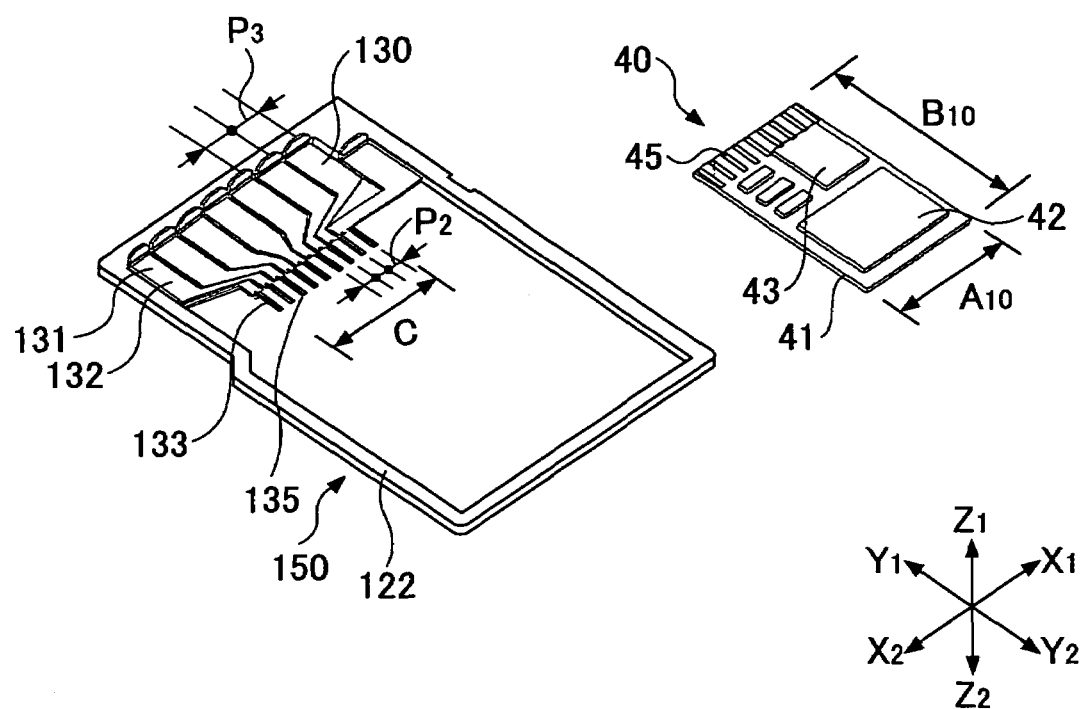
FIG. 12 is an exploded perspective view of a lower case assembly body of the small size memory card of the second embodiment of the present invention.

FIG. 10 is a perspective view of a small size memory card 120 of a second embodiment of the present invention. FIG. 11 is an exploded perspective view of the small size memory card 120 of the second embodiment of the present invention. FIG. 12 is an exploded perspective view of a lower case assembly body 160 of the small size memory card of the second embodiment of the present invention.

The width in X1-X2 direction of the small size memory card 120 is A2. The length in Y1-Y2 direction of the memory card 120 is B2. Hence, the memory card 20 has an area of A2×B2 smaller than the area of the memory card 20.

The memory chip module 40 shown in FIG. 4-(B) and FIG. 4-(D) is installed in the memory card 120. Hence, the memory chip module 40 can be commonly used.

Referring to FIG. 12, plural terminal members 131 which form a terminal member group 130 are insert-molded in the lower case 122 of the terminal group attaching lower case 150.

Each of the terminal members 131 has a memory card terminal part 132 provided at a Y1 side and a memory chip module terminal part 133 provided at a Y2 side. The memory card terminal parts 132 are arranged with a pitch $P_3$ and exposed through the windows of the lower case 122.

The memory chip module terminal parts 133 having the same structure as the memory chip module terminal parts 33 shown in FIG. 5 are arranged, as well as the case shown in FIG. 4, with a pitch $P_2$ and form the memory chip module terminal part group 135.

The memory chip module 40 is connected to the memory chip module terminal part 133 and provided on the terminal group attaching lower case 150 so that the lower case assembly 160 is assembled. The upper case 125 covers the lower case assembly body 160 and the periphery part of the upper case 125 is supersonically adhered to the periphery part of the lower case 122. Thus, the small size memory card 120 is completed.

Figure 13:
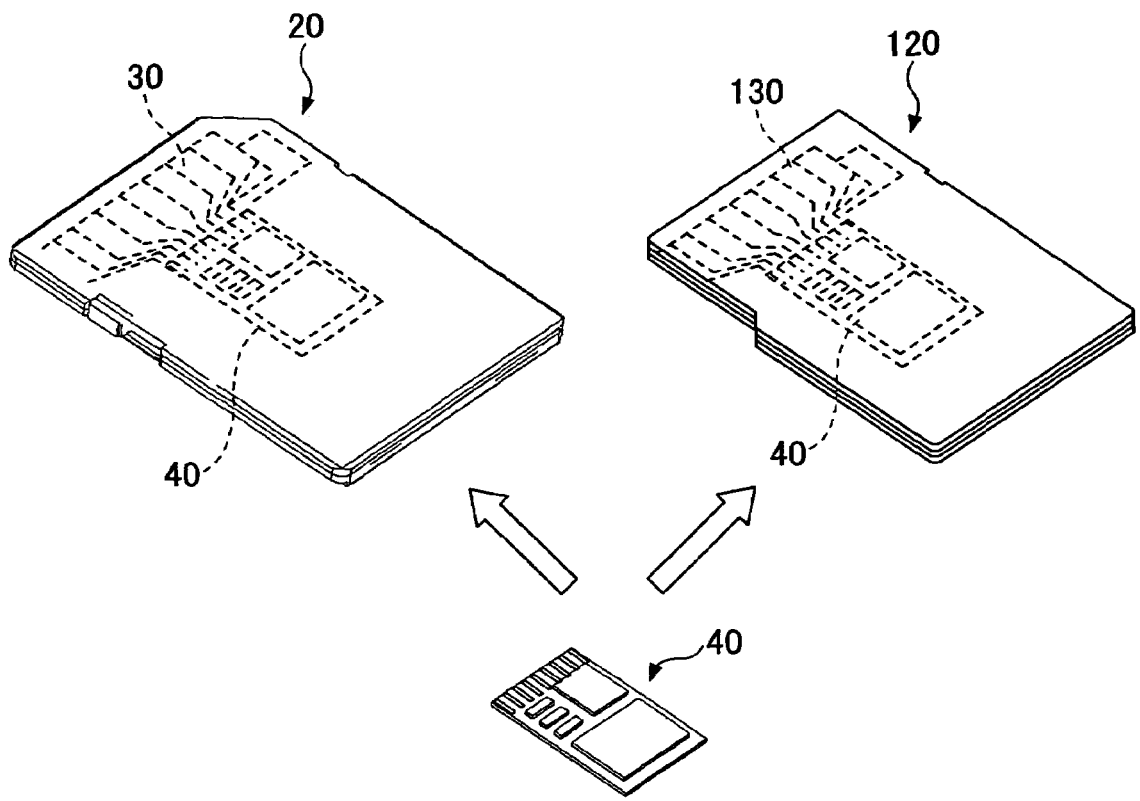
FIG. 13 is a view for explaining the memory chip that is commonly used.

FIG. 13 is a view for explaining the memory chip that is commonly used.

As shown in FIG. 13, the memory chip module 40 is commonly used so that the memory card 20 and the small size memory card 120 are manufactured. Accordingly, for the purpose of manufacturing the memory card 20 and the small size memory card 120, only a single kind of the memory chip module 40 is required and therefore high productivity can be obtained.

Figure 16:
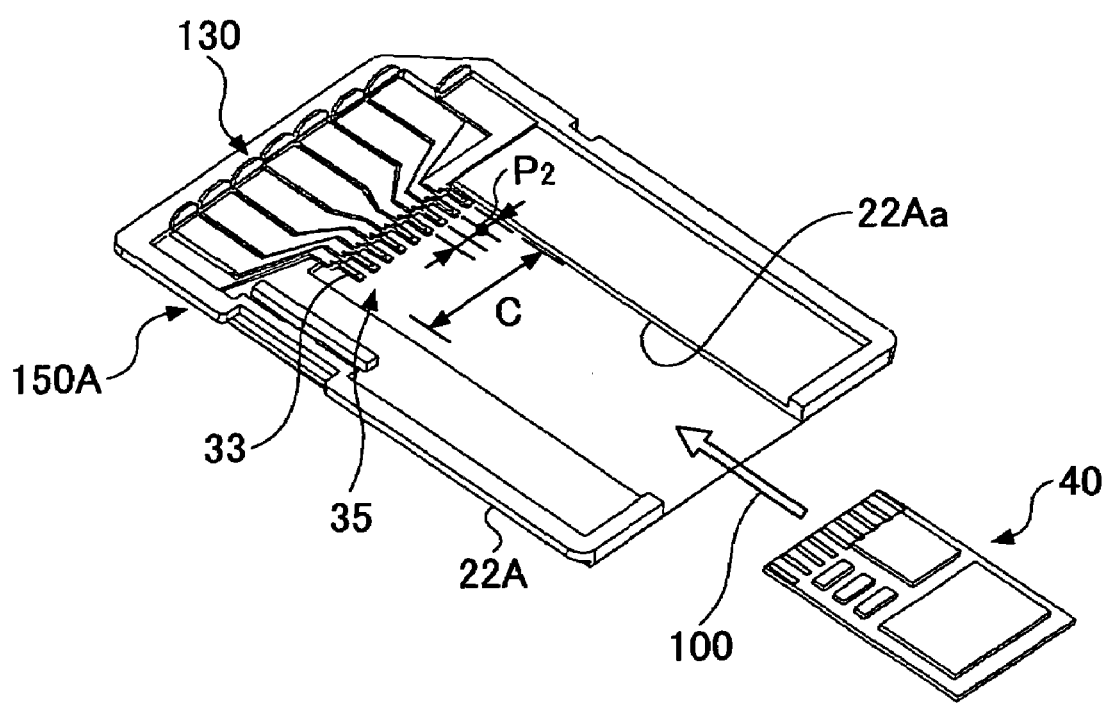
FIG. 16 is an exploded perspective view of a lower case assembly body of the memory card of the third embodiment of the present invention.

FIG. 14 is a perspective view of a memory card 20A of a third embodiment of the present invention. FIG. 15 is an exploded perspective view of the memory card 20A of the third embodiment of the present invention. FIG. 16 is an exploded perspective view of a lower case assembly body of the memory card of the third embodiment of the present invention.

As shown in FIG. 16, a groove forming part 22Aa is formed in the lower case 22A. The grove forming part 22A guides an insertion of the memory chip module 40. The memory chip module 40 and the memory chip module terminal part 33 are connected by guiding and inserting the memory chip module 40 into the groove forming part 22Aa, as shown by an arrow 100, from the Y2 side of the lower case 22A.

Figure 17:
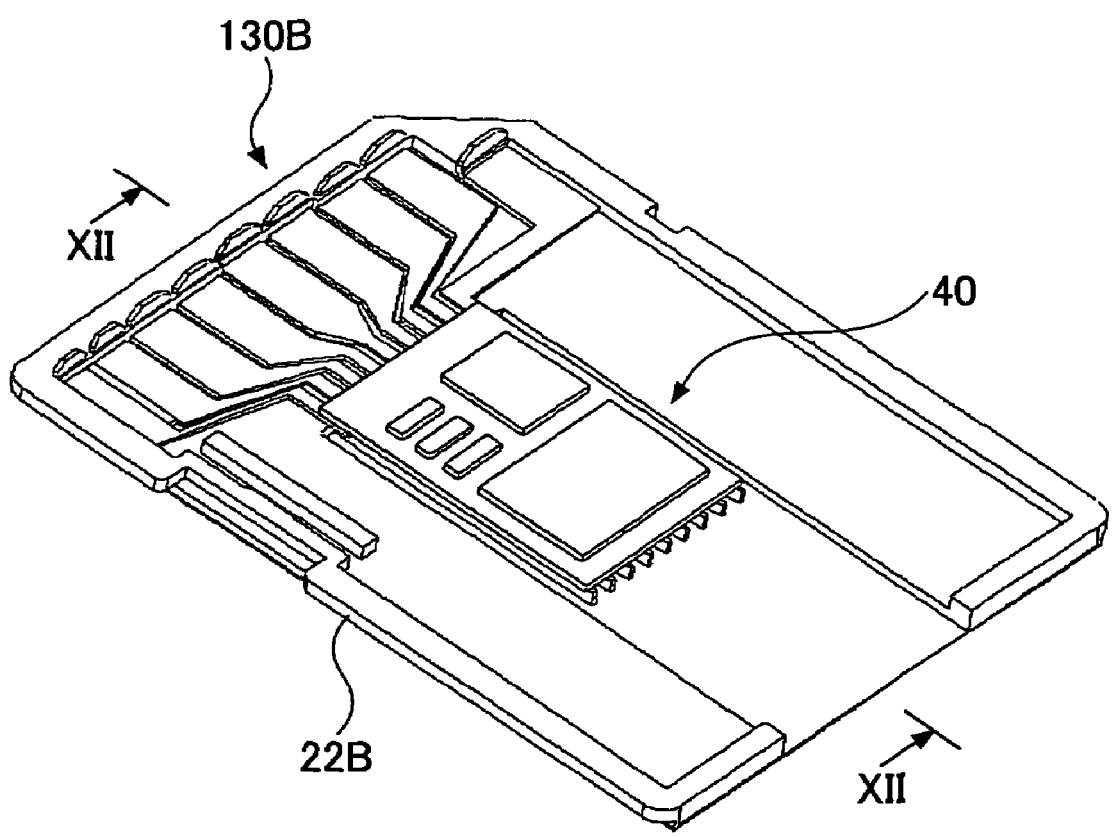
FIG. 17 is a perspective view of a memory card of a fourth embodiment of the present invention.
Figure 18:
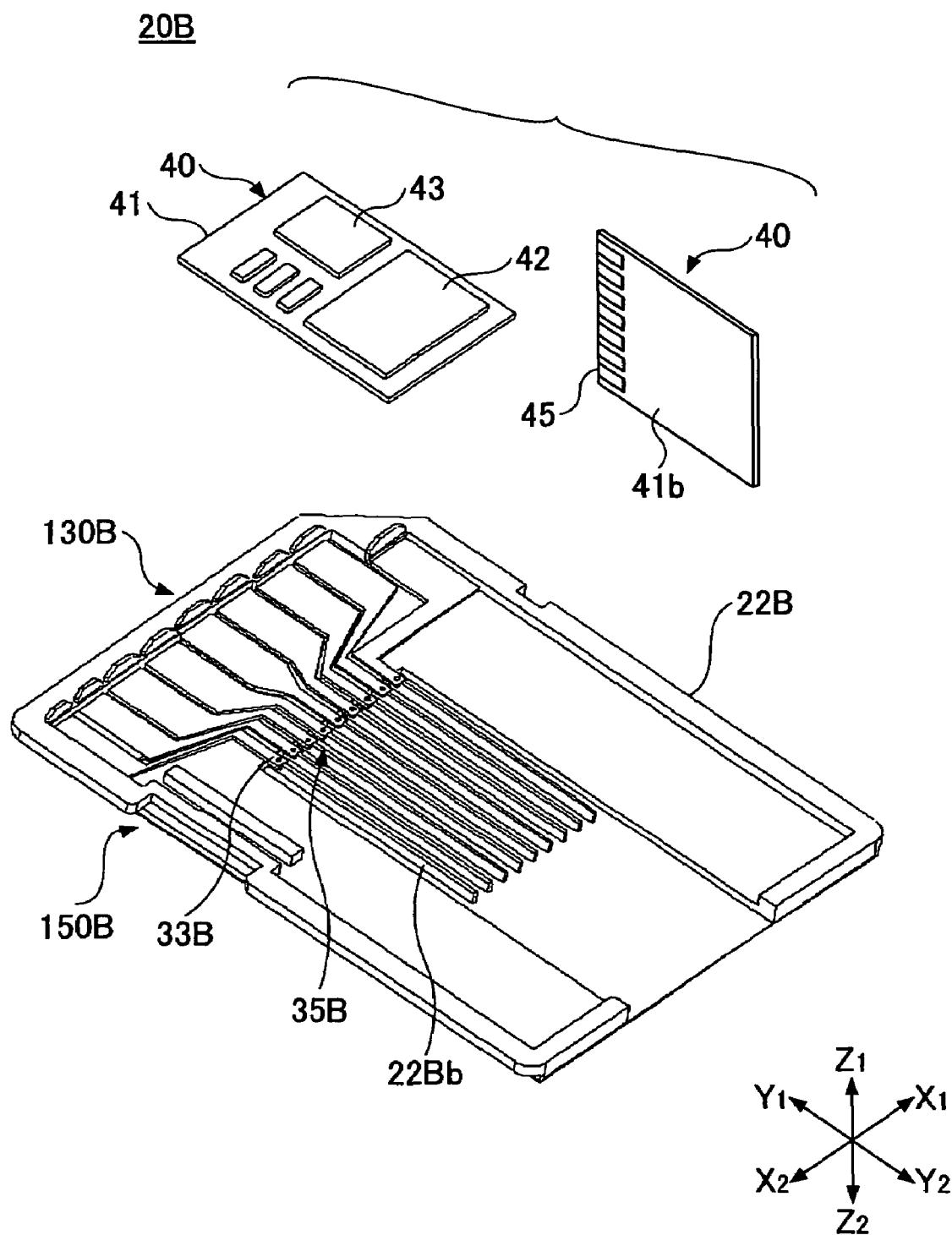
FIG. 18 is an exploded perspective view of a lower case assembly body of the memory card of the fourth embodiment of the present invention.
Figure 19:
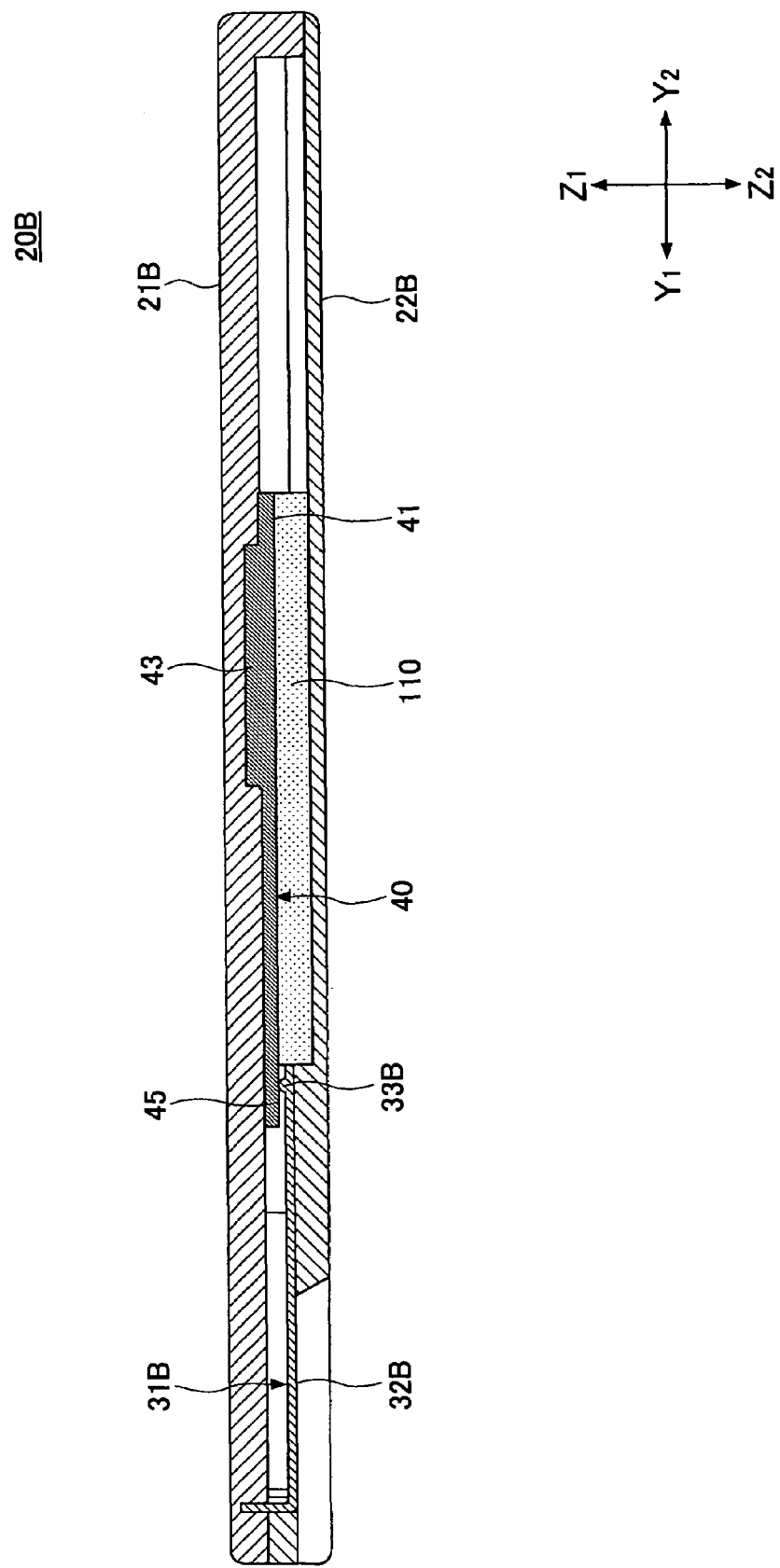
FIG. 19 is an enlarged cross-sectional view taken along a line XII-XII of FIG. 17.

FIG. 17 is a perspective view of a memory card 20B of a fourth embodiment of the present invention. FIG. 18 is an exploded perspective view of a lower case assembly body of the memory card 20B of the fourth embodiment of the present invention. For the convenience of explanation, the illustration of the upper case is omitted. FIG. 19 is an enlarged cross-sectional view taken along a line XII-XII of FIG. 17.

The memory card 20B has a structure where the memory chip module 40 is adhered to the lower case 22b by the adhesive 110.

Figure 20:
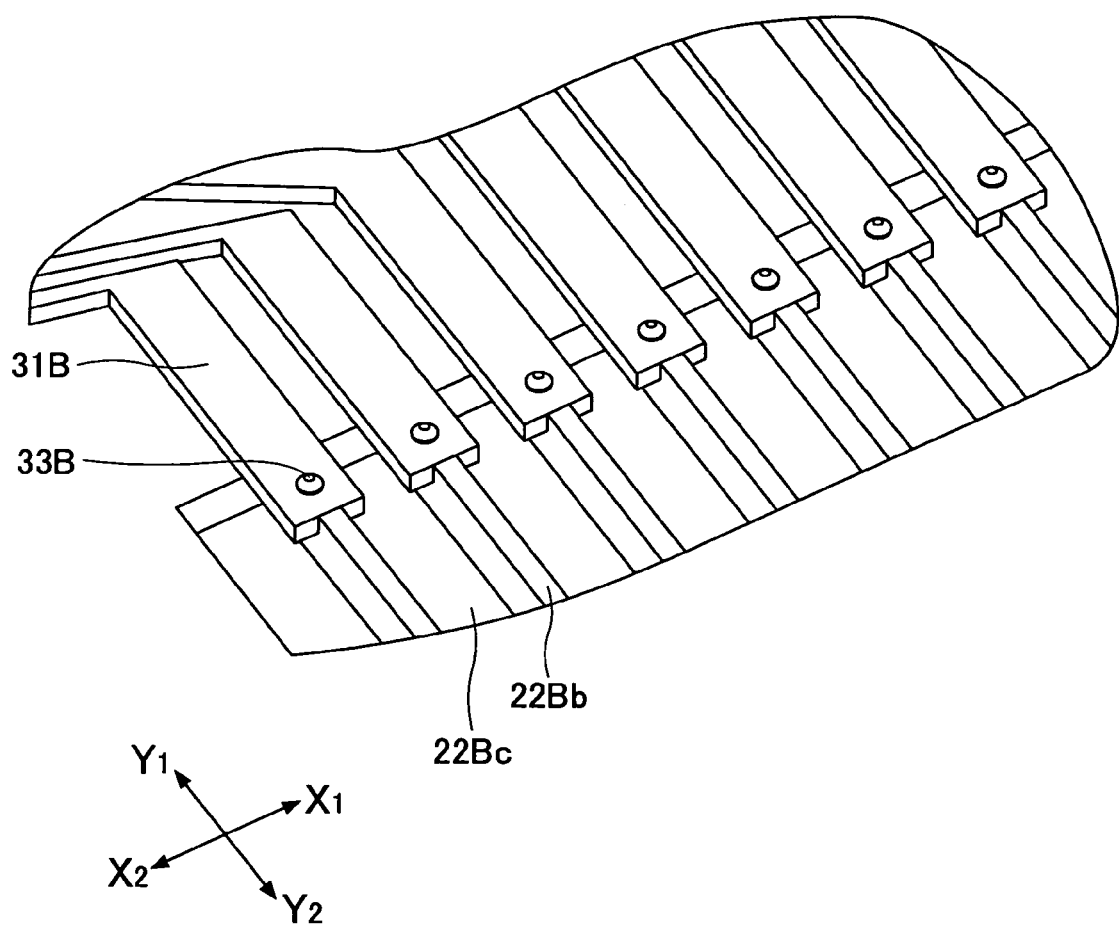
FIG. 20 is an enlarged view of a memory chip module terminal part having a bump-shaped configuration of the terminal member shown in FIG. 18.

FIG. 20 is an enlarged view of a memory chip module terminal part having a bump-shaped configuration of the terminal member shown in FIG. 18.

As shown in FIG. 18 and FIG. 20, the memory card 20B has a memory chip module terminal part 33B having a bump-shaped configuration of the terminal member 31B. Plural ribs 22Bb are formed in the lower case 22B and plural grove forming parts 22Bc are formed in the lower case 22B. Plural groove forming parts 22Bc are configured to hold the adhesive 110.

As shown in FIG. 19, the pad-shaped terminal 45 comes in contact with the memory chip module terminal part 33B having a bump configuration so that the memory chip module 40 is adhered on the lower case 22B by the adhesive 110.

The present invention is not limited to these embodiments, but variations and modifications may be made without departing from the scope of the present invention.

This patent application is based on Japanese Priority Patent Application No. 2005-177641 filed on Jun. 17, 2005 and the entire contents of which are hereby incorporated by reference.

What is claimed is:

1. A memory card having a main body with a memory chip module including a memory chip mounted thereon, the memory card comprising:

a plurality of terminal members provided on the memory card main body, in line, each of the terminal members having a first terminal part and a second terminal part;

the first terminal part of each terminal member being provided at a head end of a lower surface of the memory card, so as to be exposed, where a surface of the memory chip module on which the memory chip is mounted is situated at an upper surface of the memory card; and the second terminal part of each terminal member being connected to the memory chip module, the second terminal part configured to be connected to a pad provided on the surface of the memory chip module on which the memory chip is mounted, wherein the second terminal part of each of the terminal members has a fork-shaped configuration, each second terminal part including a lower side terminal piece having a finger-shaped configuration and an upper side terminal piece having a finger-shaped configuration and a spring capability, an edge of the board of the memory chip module, where the pad-shaped terminals are formed, is held by the second terminal parts, the second terminal part of each of the terminal members has a bump-shaped configuration and is provided on the terminal member, and an edge of the board of the memory chip module, where the pad-shaped terminals are formed, is adhered to the second terminal part.

2. A memory card, comprising:

a memory card main body;

a plurality of terminal members provided on the memory card main body, in line; and a memory chip module installed on the memory card main body, the memory chip module comprising a memory chip mounted on a board and a plurality of pad-shaped terminals provided at an end of the board;

each of the terminal members having a first terminal part and a second terminal part, the first terminal part being exposed at a lower surface at a head end of the memory card main body, where a surface of the memory chip module on which the memory chip is mounted is situated at an upper surface of the memory card; and the second terminal part being provided in arrangement with a corresponding pad-shaped terminal and connected to the corresponding pad-shaped terminal, the second terminal part configured to be connected to a pad provided on the surface of the memory chip module on which the memory chip is mounted, wherein the second terminal part of each of the terminal members has a fork-shaped configuration, each second terminal part including a lower side terminal piece having a finger-shaped configuration and an upper side terminal piece having a finger-shaped configuration and a spring capability, an edge of the board of the memory chip module, where the pad-shaped terminals are formed, is held by the second terminal parts, the second terminal part of each of the terminal members has a bump-shaped configuration and is provided on the terminal member, and an edge of the board of the memory chip module, where the pad-shaped terminals are formed, is adhered to the second terminal part.

3. The memory card as claimed in claim 2, wherein:

the memory card main body is a synthetic resin molded article; and the terminal members are insert-molded in the memory card main body.

4. The memory card as claimed in claim 2, wherein:

each terminal member has a curved shaped part provided at a head end of the first terminal part.

* * * * *